(12) United States Patent
Liu et al.

(10) Patent No.: US 12,538,770 B2
(45) Date of Patent: Jan. 27, 2026

(54) INTERCONNECTION LAYER FILLED IN THROUGH-SILICON VIA (TSV) SEMICONDUCTOR DEVICE AND MANUFACTURING METHOD THEREFOR

(71) Applicant: WUHAN XINXIN SEMICONDUCTOR MANUFACTURING CO., LTD., Hubei (CN)

(72) Inventors: Tianjian Liu, Hubei (CN); Rujin Zhou, Hubei (CN); Guoliang Ye, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 371 days.

(21) Appl. No.: 18/250,840

(22) PCT Filed: Dec. 14, 2020

(86) PCT No.: PCT/CN2020/136262
§ 371 (c)(1),
(2) Date: Apr. 27, 2023

(87) PCT Pub. No.: WO2022/104972
PCT Pub. Date: May 27, 2022

(65) Prior Publication Data
US 2024/0021470 A1 Jan. 18, 2024

(30) Foreign Application Priority Data
Nov. 20, 2020 (CN) .......................... 202011309816.4

(51) Int. Cl.
*H01L 21/768* (2006.01)
*H01L 23/48* (2006.01)

(52) U.S. Cl.
CPC ...... *H01L 21/76898* (2013.01); *H01L 23/481* (2013.01)

(58) Field of Classification Search
CPC ............. H01L 23/481; H01L 21/76898; H01L 21/76895; H01L 2224/03831; H01L 24/03; H01L 21/76897
See application file for complete search history.

(56) References Cited

U.S. PATENT DOCUMENTS

| 5,981,395 | A | 11/1999 | Huang et al. |
| 9,793,156 | B1 | 10/2017 | Yang |
| 2012/0306095 | A1* | 12/2012 | Han ...................... H01L 23/481 257/774 |

FOREIGN PATENT DOCUMENTS

| CN | 103474416 A | 12/2013 |
| CN | 109148275 A | 1/2019 |
| CN | 109166820 A | 1/2019 |

* cited by examiner

*Primary Examiner* — Changhyun Yi
(74) *Attorney, Agent, or Firm* — MUNCY, GEISSLER, OLDS & LOWE, P.C.

(57) ABSTRACT

A semiconductor device and a manufacturing method therefor are disclosed, in which a first opening is formed in a first metal layer by etching away part of the first metal layer, and a second metal layer is filled in the first opening and is electrically connected to the remainder of the first metal layer. A TSV extends sequentially through a substrate and a partial thickness of a dielectric layer so that the second metal layer is exposed therein, and an interconnect layer in the TSV is electrically connected to the second metal layer. In this way, the first metal layer can be picked up as long as projections of the second metal layer and the interconnect layer on the substrate are encompassed within a projection (Continued)

of the first metal layer on the substrate, without any additional lateral area of the first metal layer being occupied by the TSV.

13 Claims, 8 Drawing Sheets

INTERCONNECTION LAYER FILLED IN THROUGH-SILICON VIA (TSV) SEMICONDUCTOR DEVICE AND MANUFACTURING METHOD THEREFOR

TECHNICAL FIELD

The present invention pertains to the field of integrated circuit fabrication technology, and particularly to a semiconductor device and a method of manufacturing the same.

BACKGROUND

Through-silicon via (TSV) is a new technology for creating vertical interconnect accesses between wafers, which connect the wafers together. It enables wafers to be three-dimensionally stacked with higher density.

In practical applications, an interconnect layer is usually filled in a TSV, which is electrically connected to and thereby leads out a metal layer in a wafer. In TSV interconnection processes for three-dimensional integration, in order to fabricate a TSV with a depth-to-width aspect ratio greater than 5:1 and a depth exceeding 15 microns, copper is often chosen as the material for the interconnect layer filled in the TSV. Conventionally, considering process complexity and reliability (e.g., surface cleaning of the deep TSV and metal layer, deposition of an interface barrier layer, etc.), the metal layer electrically connected to the copper interconnect layer in the TSV has to be also made of copper.

Figure 1:
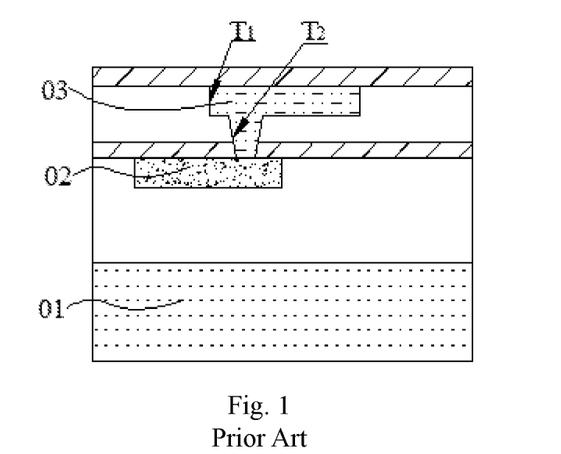
FIGS. 1 to 2 are schematic diagrams showing various steps in a method of manufacturing a semiconductor device.
Figure 2:
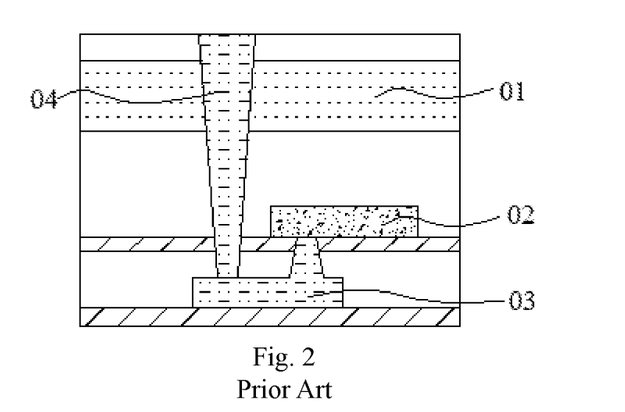

However, in many cases, the wafer is provided with only aluminum metal layers, or the metal layer for subsequent three-dimensional integration and interconnection therein is for an aluminum process and unsuitable for direct interconnection with the copper interconnect layer in the TSV. In order to overcome this, as shown in FIG. 1, over the aluminum metal layer 02, it is necessary to use a first photomask to form a hole $T_2$ running perpendicular to a substrate 01 and then use a second photomask to form another hole $T_1$ running parallel to the substrate 01. Additionally, a first copper metal layer 03 is formed in the holes $T_2$ and $T_1$ so as to be connected to the aluminum metal layer 02. Subsequently, the wafer is flipped over, and the second photomask is used to form a TSV extending through the substrate 01. A second copper metal layer 04 is then filled in the TSV so as to be connected to the first copper metal layer 03. Thus, two photomasks and a Damascene process are employed to fabricate the first copper metal layer 03. Firstly, in this approach, the use of two photomasks in the formation of the first copper metal layer 03 leads to high process cost. Secondly, the additional extension (in the horizontal direction) for accommodating the passage of the TSV leads to a waste of the wafer's effective area. Thirdly, in order to enable desirable contact of the first copper metal layer 03 with the aluminum metal layer 02 within the hole $T_2$, high control complexity is involved in the process.

SUMMARY OF THE INVENTION

It is an objective of the present invention to provide a semiconductor device and a method of manufacturing it, which enable increased wafer area utilization, the use of fewer photomasks, lower cost and reduced process complexity.

To this end, the present invention provides a method of manufacturing a semiconductor device, which comprises:

providing a first wafer including a substrate, a dielectric layer on the substrate and a first metal layer embedded in the dielectric layer;

etching away part of the first metal layer, resulting in the formation of a first opening in the first metal layer;

forming a second metal layer, which is filled in the first opening and electrically connected to the remainder of the first metal layer;

forming a TSV, which sequentially extends through the substrate and a partial thickness of the dielectric layer so that the second metal layer is exposed therein; and forming an interconnect layer, which is filled in the TSV and is electrically connected to the second metal layer.

Additionally, the first wafer may further include a passivation layer, which covers at least the dielectric layer.

Additionally, the passivation layer may define a probing window, in which part of the first metal layer having a protrusion is exposed, wherein the second metal layer also fills the probing window.

Additionally, the formation of the first opening resulting from etching away the part of the first metal layer may include partially or entirely etching away the part of the first metal layer that has the protrusion and is exposed in the probing window, thereby resulting in the formation of the first opening.

Additionally, the passivation layer may further cover the entire first metal layer.

Additionally, the formation of the first opening resulting from etching away the part of the first metal layer may include:

etching the passivation layer to form therein a passivation layer opening, in which part of the first metal layer is exposed;

forming a patterned photoresist layer, which covers the remainder of the passivation layer and the part of the first metal layer and defines a first window having a cross-sectional width smaller than a cross-sectional width of the passivation layer opening in a cross-sectional plane perpendicular to the substrate; and with the patterned photoresist layer serving as a mask, etching away part of the first metal layer exposed in the first window, resulting in the formation of the first opening, wherein in the step in which the second metal layer is formed, the second metal layer is so formed as to also fill the passivation layer opening.

Additionally, the formation of the first opening resulting from etching away the part of the first metal layer may include:

forming a patterned photoresist layer on the passivation layer, the patterned photoresist layer defining a second window above the first metal layer, the second window having a cross-sectional width smaller than a cross-sectional width of the first metal layer in a cross-sectional plane perpendicular to the substrate; and with the patterned photoresist layer serving as a mask, etching away part of the first metal layer exposed in the second window, resulting in the formation of the first opening.

Additionally, the first metal layer, the second metal layer and the interconnect layer may be aluminum, copper and copper, respectively, or aluminum, copper and tungsten respectively, or tungsten, copper and copper respectively.

Additionally, the method may further include, after the formation of the second metal layer and before the formation of the TSV, bonding the side of the first wafer where the second metal layer is exposed to a second wafer.

The present invention also provides a semiconductor device, including:
- a substrate, a dielectric layer on the substrate and a first metal layer embedded in the dielectric layer;
- a first opening extending through the first metal layer and spanning a partial width thereof;
- a second metal layer filled in the first opening and electrically connected to the rest of the first metal layer;
- a TSV extending sequentially through the substrate and a partial thickness of the dielectric layer so that the second metal layer is exposed therein; and
- an interconnect layer filled in the TSV and electrically connected to the second metal layer.

The semiconductor device may further include a passivation layer, which covers at least the dielectric layer.

Further, in the semiconductor device, the first metal layer, the second metal layer and the interconnect layer may be aluminum, copper and copper, respectively, or aluminum, copper and tungsten respectively, or tungsten, copper and copper respectively.

Compared with the prior art, the present invention has the following benefits:

It provides a semiconductor device and a method of manufacturing it, in which a first opening is formed by etching away part of a first metal layer, and a second metal layer is filled in the first opening so as to be electrically connected to the remainder of the first metal layer. A TSV extends sequentially through a substrate and a partial thickness of a dielectric layer so that the second metal layer is exposed therein, and an interconnect layer in the TSV is electrically connected to the second metal layer. In this way, the first metal layer can be picked up as long as projections of the second metal layer and the interconnect layer on the substrate are encompassed within a projection of the first metal layer on the substrate, without any additional lateral (in the direction parallel to the substrate) area of the first metal layer being occupied by the TSV, resulting in increased utilization of the wafer's area. The second metal layer that leads out the first metal layer can be formed by only one photolithography process (using a single photomask), resulting in the use of fewer photomasks and reduced process complexity.

Further, the passivation layer may define a probing window, in which part of the first metal layer having a protrusion is exposed, and the first opening may be formed by partially or entirely etching away the part of the first metal layer that has the protrusion and is exposed in the probing window.

The part of the first metal layer having the protrusion may be a probe mark region, and etching away this region can address the non-flatness caused by the protrusion while circumventing the problems that may arise from the use of the conventional technique that achieves this by covering the protrusion with a dielectric layer and then planarizing the dielectric layer (to enable it to provide a flat surface), including issues associated with a possibly excessively large or small thickness of the dielectric layer and difficult control of the planarization process. Moreover, any additional lateral (in the direction parallel to the substrate) area of the first metal layer will not be occupied, resulting in increased utilization of the wafer's area.

In these figures,
- 01—substrate; 02—aluminum metal layer; 03—first copper metal layer; 04—second copper metal layer;
- 11—substrate; 12—dielectric layer; 13—aluminum metal layer; 13'—protrusion; 14—dielectric layer; 15—third copper metal layer; 16—isolation layer; 17—wafer; 18—fourth copper metal layer;
- 20—wafer; 21—substrate; 22—dielectric layer; 23—first metal layer; 23'—protrusion; 24—passivation layer; 25—patterned photoresist layer; 26—second metal layer; 27—insulating layer; 28—interconnect layer; 30—second wafer; 31—bonding layer.

DETAILED DESCRIPTION

As discussed in the Background section, in case of a wafer being provided with only aluminum metal layers or a metal layer therein for subsequent three-dimensional integration and interconnection being for an aluminum process, conventional interconnection of the metal layer in the wafer with a copper interconnect layer in a through-silicon via (TSV) are associated with the problems of high process complexity, a significant waste of the wafer's effective area and challenges in process control.

The inventors have also found that an aluminum metal layer in a wafer is susceptible to damage when the wafer is being tested with probe needles, and the formation of protrusions tend to occur at locations whether the probe needles come into contact with the aluminum metal layer. In order to ensure success of the subsequent three-dimensional integration and interconnection process, the side that has undergone testing with probe needles (i.e., the side with probe marks) must be planarized before interconnection with a copper metal layer.

A detailed process of interconnecting an aluminum metal layer in a wafer and a copper metal layer in a TSV will be described below with reference to FIGS. 3 to 7.

Figure 3:
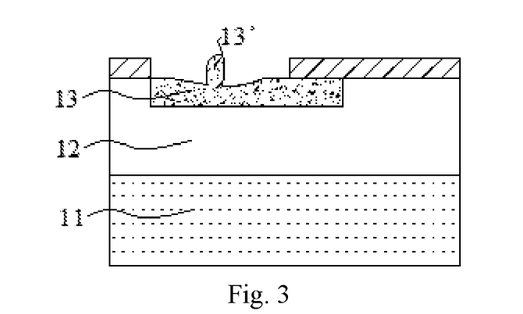
FIGS. 3 to 7 are schematic diagrams showing various steps in another method of manufacturing a semiconductor device.

As shown in FIG. 3, the wafer includes a substrate 11, a dielectric layer 12 on the substrate 11 and an aluminum metal layer 13 embedded in the dielectric layer 12. On the aluminum metal layer 13, there is a protrusion 13' resulting from contact of a probe needle.

Figure 4:
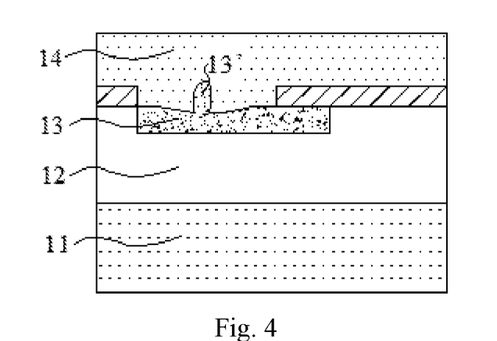

As shown in FIG. 4, a dielectric layer 14 is deposited so as to cover the aluminum metal layer 13 and the protrusion 13', and a chemical mechanical polishing (CMP) process is carried out to planarize a surface of the dielectric layer 14, thereby overcoming the problem of non-flatness caused by the protrusion 13'.

Figure 5:
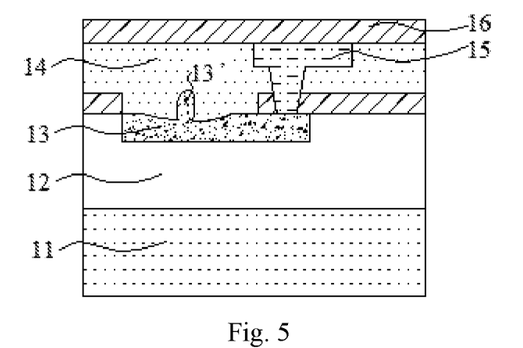

As shown in FIG. 5, a hole is formed in the dielectric layer 14, and a third copper metal layer 15 is filled in the hole. The third copper metal layer 15 is so formed as to be electrically connected to the aluminum metal layer 13. An isolation layer 16 is then formed so as to cover the dielectric layer 14 and the third copper metal layer 15.

Figure 6:
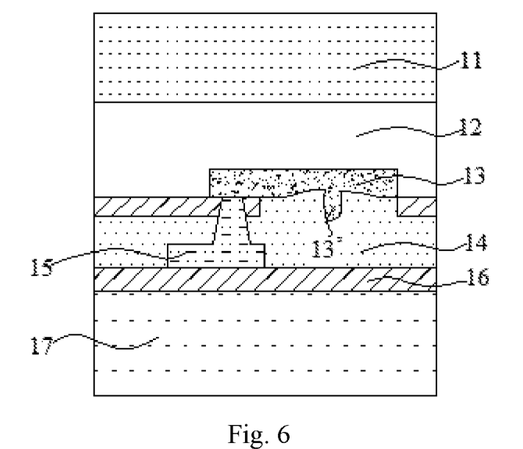

As shown in FIG. 6, the isolation layer 16 is bonded to another wafer 17.

Figure 7:
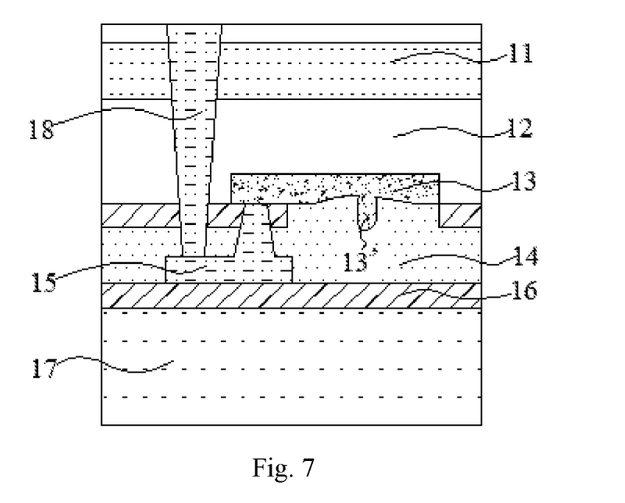

As shown in FIGS. 6 and 7, the substrate 11 is thinned, and a TSV is formed therein. Moreover, a fourth copper metal layer 18 is filled in the TSV, the fourth copper metal layer 18 is electrically connected to the third copper metal layer 15. Since the third copper metal layer 15 is electrically connected to the aluminum metal layer 13, through forming the two copper metal layers, the aluminum metal layer 13 is picked up by the TSV.

Although the method shown in FIGS. 3 to 7 enables planarization of the protrusion 13' and allows the aluminum metal layer 13 to be picked up, it is still associated with some problems. Firstly, the planarization is challenging and difficult to control. Specifically, when the dielectric layer 14 is deposited to a large thickness, although it can have a flat surface after the planarization process, its thickness will create difficulties in the subsequent formation of a hole through the dielectric layer 14, bringing great challenges to the subsequent TSV process. For example, it is may be challenging to form the hole and fill the third copper metal layer 15 in the hole. Moreover, the third copper metal layer 15 may be required to have an increased thickness and size. On the other hand, when the dielectric layer 14 is deposited to a small thickness, control of a polish stop for the CMP process would be difficult, probably causing the polishing parts to come into contact with the protrusion 13'. This may lead to metal cross-contamination, which is detrimental to the manufacturing equipment.

Secondly, an additional extension (in the horizontal direction) for accommodating the passage of the TSV is needed and required to be located away from the probe mark, leads to a waste of the wafer's effective area.

Based on in-depth research taking into account of the above issues, in embodiments of the present invention, there are provided a semiconductor device and a method of manufacturing the device. The present invention will be described in greater detail below with reference to the accompanying drawings and to specific embodiments. Advantages and features of the present invention will become more apparent from the following description. Note that the figures are provided in a very simplified form not necessarily drawn to exact scale and for the only purpose of facilitating easy and clear description of the embodiments.

Figure 8:
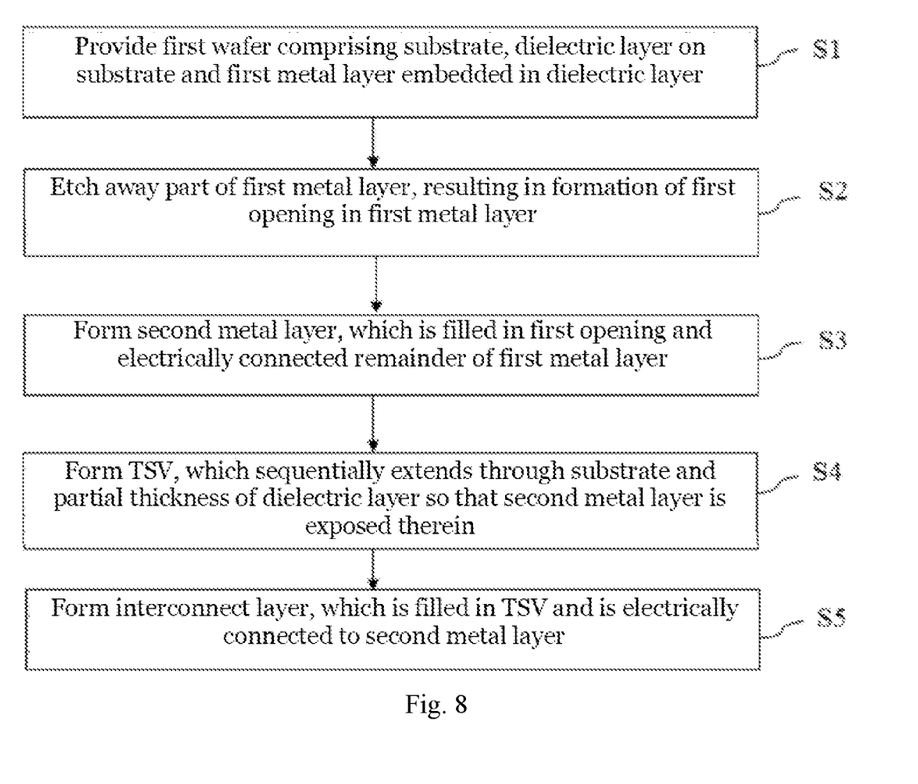
FIG. 8 is a flowchart of a method of manufacturing a semiconductor device according to an embodiment of the present invention.

In an embodiment of the present invention, there is provided a method of manufacturing a semiconductor device. As shown in FIG. 8, the method includes:
  providing a first wafer including a substrate, a dielectric layer on the substrate and a first metal layer embedded in the dielectric layer;
  etching away part of the first metal layer, thereby forming a first opening in the first metal layer;
  forming a second metal layer, the second metal layer filled in the first opening so as to be electrically connected to the remainder of the first metal layer;
  forming a TSV, which sequentially extends though the substrate and a partial thickness of the dielectric layer so that the second metal layer is exposed in the TSV; and
  forming an interconnect layer, the interconnect layer filled in the TSV so as to be electrically connected to the second metal layer.

A detailed description of various steps in a method of manufacturing a semiconductor device according to an embodiment of the present invention will be set forth below with reference to FIGS. 9a to 17.

Figure 9A:
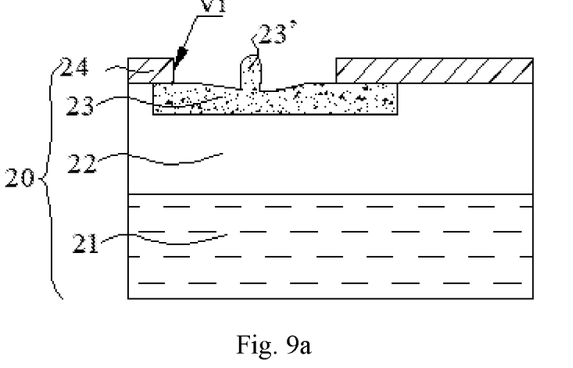
FIGS. 9*a*, 9*b*, 10*a*, 10*b*, 11*a* to 11*c*, 12*a*, 12*b*, 13*a*, 13*b*, 14*a*, 14*b* and 15 to 17 are schematic diagrams showing various steps in a method of manufacturing a semiconductor device according to an embodiment of the present invention.

As shown in FIG. 9a, a first wafer 20 is provided, the first wafer 20 includes a substrate 21, and sequentially stacked on the substrate 21, a dielectric layer 22 and a passivation layer 24. A first metal layer 23 is embedded in the dielectric layer 22, and there is a probing window $V_1$ in the passivation layer 24, in which part of the first metal layer 23 is exposed. A protrusion 23' is present on the part of the first metal layer 23 exposed in the probing window $V_1$. The protrusion 23' is a result of contact of a probe needle with the first metal layer 23 for a testing purpose.

In embodiments of the present invention, the substrate may be a semiconductor substrate, which may be made of any semiconductor material suitable for the semiconductor device (e.g., Si, SiC, SiGe, etc.) In some other embodiment, the substrate may be alternatively implemented as one of various composite substrates such as Si-on-insulator (SOI) and SiGe-on-insulator (SGOI). As would be appreciated by those skilled in the art, the substrate is not limited to any particular type and may be properly selected according to the requirements of the practical applications. Various structures may be formed in the substrate (not limited to the semiconductor device being fabricated), such as gate structures.

The first metal layer 23 may be an aluminum layer, for example. The passivation layer 24 may include a silicon oxide layer on the dielectric layer 22 and a silicon nitride layer on the silicon oxide layer. The silicon oxide layer may have desirable coverage and desirably protect the first metal layer and the dielectric layer while relieving stress caused by the silicon nitride layer. The silicon nitride layer may have desirable compactness and may be implemented as a hard film capable of providing good surface projection to the semiconductor device.

Figure 9B:
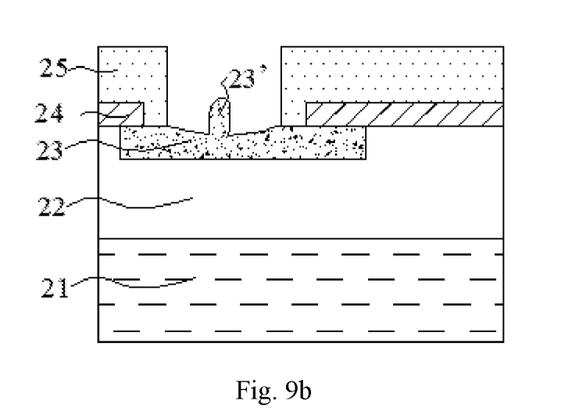
Figure 13A:
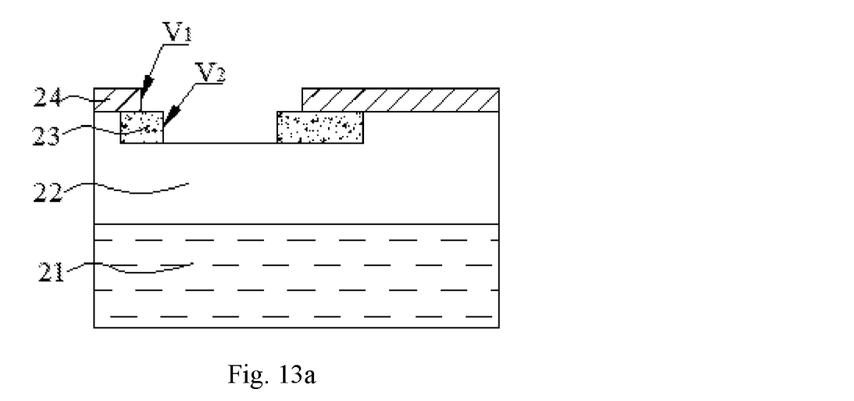
Figure 13B:
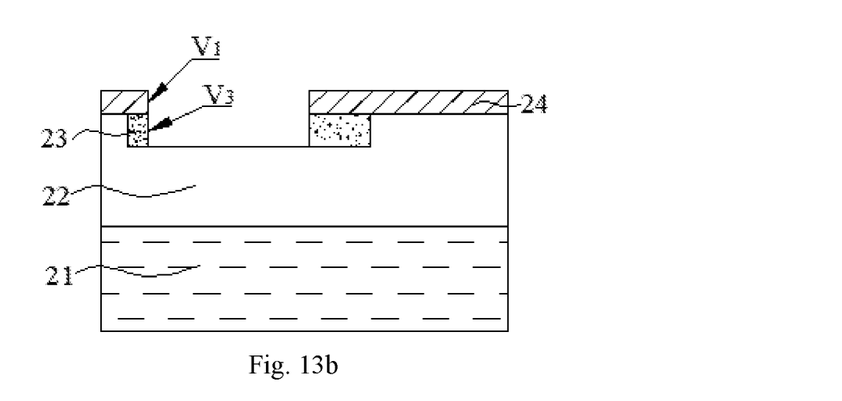

As shown in FIGS. 9b, 13a and 13b, the formation of the first opening by etching away the part of the first metal layer may in particular include: partially or entirely etching away the part of the first metal layer 23 containing the protrusion 23' exposed in the probing window $V_1$, thereby forming the first opening ($V_2$ or $V_3$). In one embodiment, as shown FIGS. 9b and 13a, a patterned photoresist layer 25 is formed, the patterned photoresist layer 25 may cover the passivation layer 24 and optionally the first metal layer 23 underlying and extending along an edge of the probing window $V_1$. In a cross-sectional plane perpendicular to the substrate 21, a width of the opening in the patterned photoresist layer 25 is smaller than a width of the probing window $V_1$. The protrusion 23' is exposed in the opening in the patterned photoresist layer. With the patterned photoresist layer serving as a mask, the part of the first metal layer 23 containing the protrusion 23' and exposed in the probing window $V_1$ is partially etched away, forming the first opening $V_2$. As a result of this, a probe mark region is removed. Subsequently, the patterned photoresist layer is stripped away. In an alternative embodiment, as shown in FIG. 13b, the part of the first metal layer 23 containing the protrusion 23' and exposed in the probing window $V_1$ may be entirely etched away, thus forming the first opening $V_3$ and removing the probe mark region.

FIGS. 9a and 9b show a first example of the first wafer. In this example, the first wafer may have undergone testing with probe needles, which may have caused damage to the first metal layer 23 that is to be picked up.

Figure 10A:
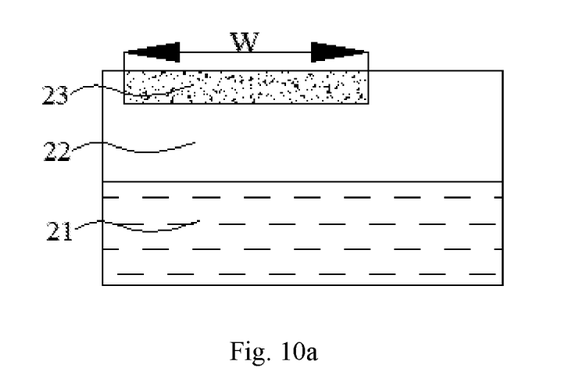
Figure 10B:
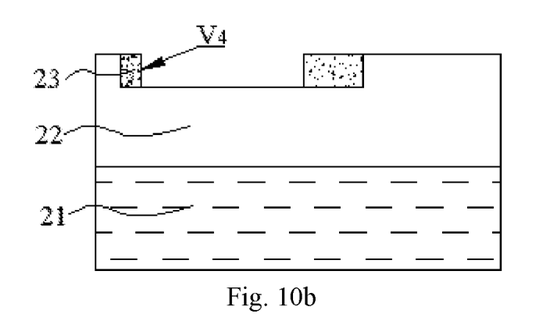

FIGS. 10a and 10b show a second example of the first wafer. In this example, the first metal layer 23 is embedded in the dielectric layer 22, and the passivation layer is not provided over the first metal layer 23 and the dielectric layer 22. The first wafer may be, for example, just delivered from a process for forming the first metal layer 23. Part of the first metal layer 23 spanning a width thereof may be then removed, resulting in the first opening $V_4$. Here, the width W of the first metal layer 23 refers to its cross-sectional width parallel to the substrate, measured in a cross-sectional plane perpendicular to the substrate 21.

Figure 11A:
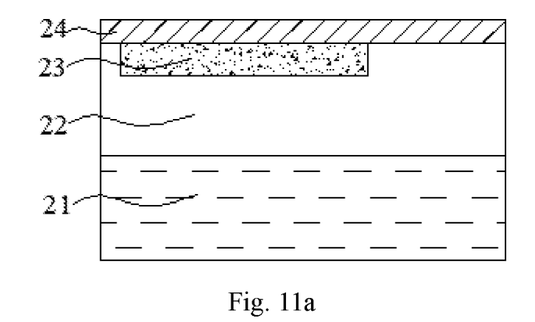
Figure 11B:
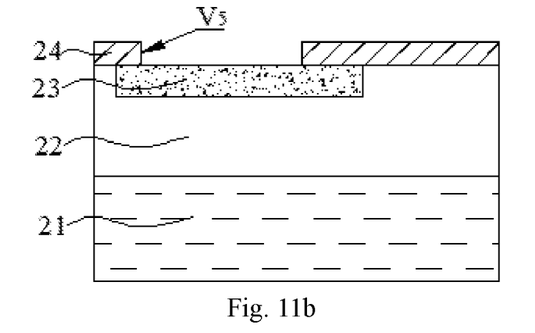
Figure 11C:
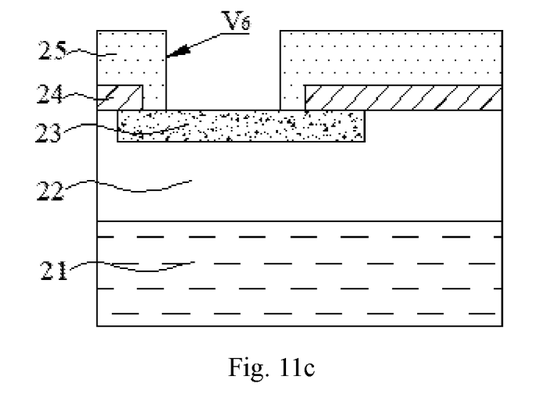

FIGS. 11a to 11c show a third example of the first wafer. In this example, the first wafer has not been subjected to testing with probe needles yet, and the first metal layer 23 and the dielectric layer 22 are being protected by the overlying passivation layer 24. As shown in FIG. 11a, the first metal layer 23 is embedded in the dielectric layer 22, and the first wafer further includes the passivation layer 24, the passivation layer 24 covers the dielectric layer 22 and the first metal layer 23. The formation of the first opening by etching away the part of the first metal layer may include the following steps.

As shown in FIGS. 11b and 11c, the passivation layer 24 is etched so that a passivation layer opening $V_5$ is formed, the part of the first metal layer 23 is exposed in the passivation layer opening $V_5$. A patterned photoresist layer 25 is then formed, the patterned photoresist layer 25 covers the remainder of the passivation layer 24 and part of the first metal layer 23. The patterned photoresist layer defines a first window $V_6$, the first window $V_6$ has a cross-sectional width smaller than the cross-sectional width of the passivation layer opening $V_5$ in a cross-sectional plane perpendicular to the substrate 21. With the patterned photoresist layer 25 serving as a mask, part of the first metal layer 23 exposed in the first window $V_6$ is etched away, resulting in the first opening. The resultant structure is the same as that shown in FIG. 13a.

FIGS. 11a to 11c show a third example of the first wafer. In this example, the first wafer has not been subjected to testing with probe needles yet, and the first metal layer 23 is being protected by the overlying passivation layer.

Figure 12A:
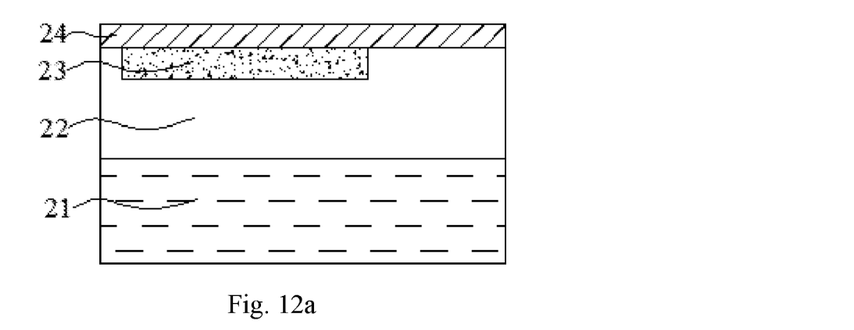
Figure 12B:
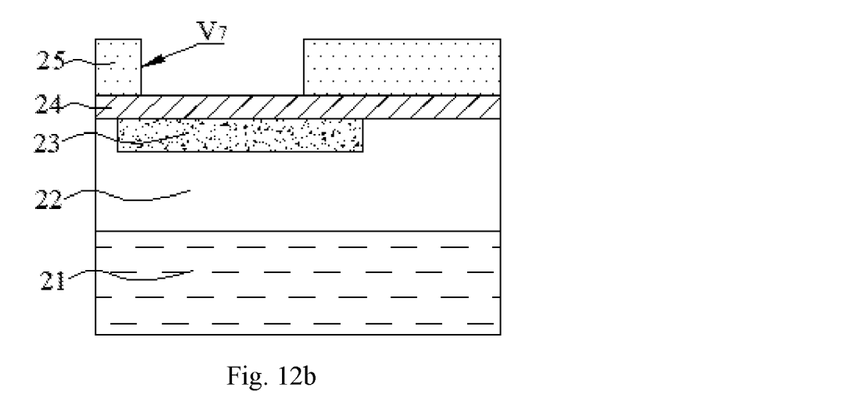

FIGS. 12a to 12b show a fourth example of the first wafer. As shown in FIG. 12a, the first metal layer 23 is embedded in the dielectric layer 22, and the first wafer further includes the passivation layer 24 that covers the dielectric layer 22 and the first metal layer 23. The formation of the first opening by etching away the part of the first metal layer may include the following steps.

As shown in FIG. 12b, a patterned photoresist layer 25 is formed on the passivation layer 24. The patterned photoresist layer 25 defines a second window $V_7$, the second window $V_7$ is formed above the first metal layer 23. In a cross-sectional plane perpendicular to the substrate 21, the second window $V_7$ has a cross-sectional width smaller than the cross-sectional width of the first metal layer 23. With the patterned photoresist layer 25 serving as a mask, portions of the passivation layer 24 and the first metal layer 23 exposed in the second window $V_7$ are etched away, resulting in the first opening. The resultant structure is the same as that shown in FIG. 13b.

Figure 14A:
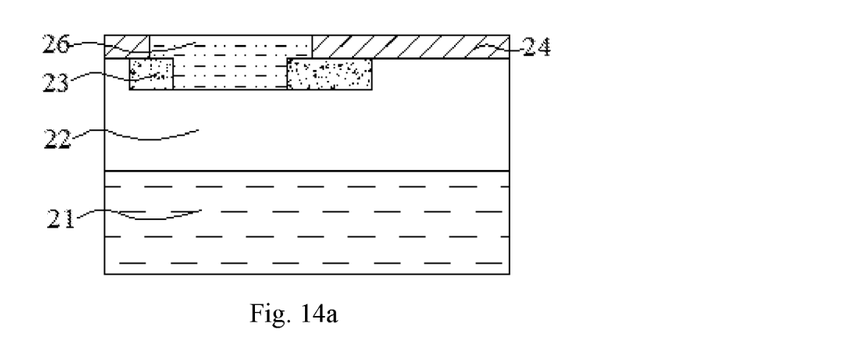

As shown in FIGS. 13a and 14a, a second metal layer 26 is formed, the second metal layer 26 fills the probing window $V_1$ and the first opening $V_2$ and be electrically connected to the remainder of the first metal layer 23. In this embodiment, there is an annular portion of the first metal layer 23 under the probing window $V_1$ and extending along an edge thereof. This enables the second metal layer 26 to have an increased contact area with the remainder of the first metal layer 23, making the electrical connection more reliable.

Figure 14B:
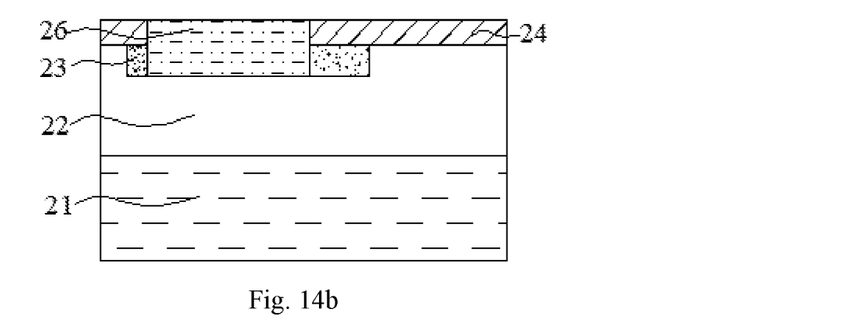

As shown in FIGS. 13b and 14b, a second metal layer 26 is formed, the second metal layer 26 fills the probing window $V_1$ and the first opening $V_2$ and be electrically connected to the remainder of the first metal layer 23.

Figure 15:
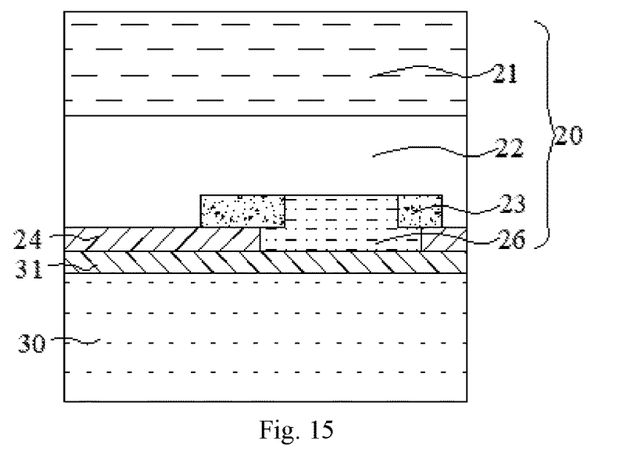
Figure 16:
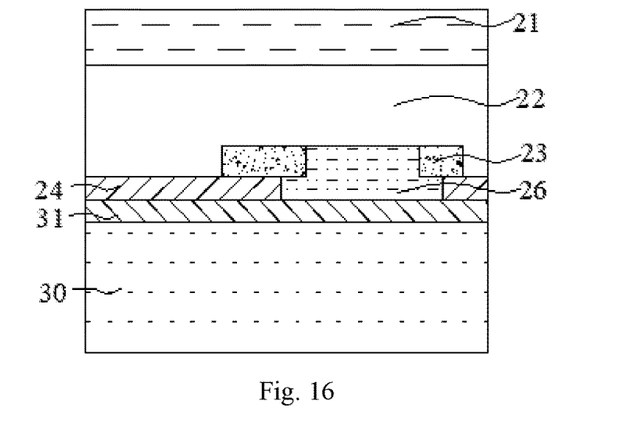

As shown in FIGS. 15 and 16, the first wafer 20 is bonded to a second wafer 30. The second wafer 30 may be a carrier wafer or a device wafer. The second wafer 30 is provided thereon with a bonding layer 31, and the second metal layer 26 and the passivation layer 24 are bonded to the bonding layer 31. The substrate 21 of the first wafer 20 is thinned.

Figure 17:
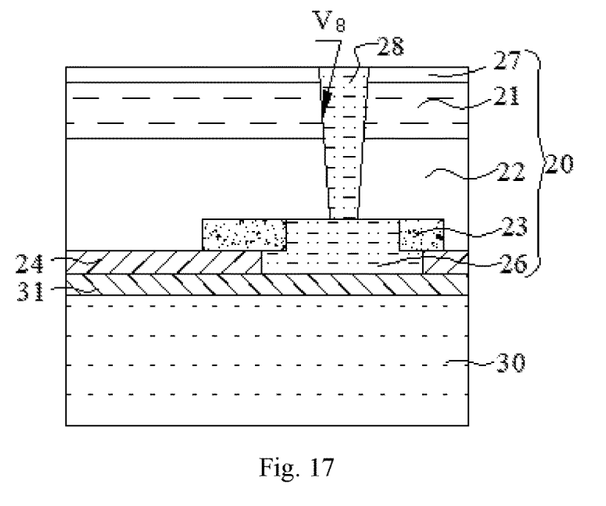

As shown in FIG. 17, an insulating layer 27 is formed on the thinned side of the substrate 21. A TSV $V_8$ is then formed by an etching process. The TSV $V_8$ sequentially extends through the insulating layer 27, the substrate 21 and a partial thickness of the dielectric layer 22, and the second metal layer 26 is exposed in the TSV $V_8$. An interconnect layer 28 is formed, the interconnect layer 28 is filled in the TSV $V_8$ and electrically connected to the second metal layer 26.

In this embodiment, the materials of the first metal layer 23, the second metal layer 26 and the interconnect layer 28 may be selected as practically needed. For example, in a first implementation, the first metal layer 23 is aluminum, the second metal layer 26 is copper, and the interconnect layer 28 is copper. In a second implementation, the first metal layer 23 is aluminum, the second metal layer 26 is copper, and the interconnect layer 28 is tungsten. In a third implementation, the first metal layer 23 is tungsten, the second metal layer 26 is copper, and the interconnect layer 28 is copper.

As shown in FIG. 17, the present invention further provides a semiconductor device, including:

a substrate 21, a dielectric layer 22 on the substrate 21 and a first metal layer 23 embedded in the dielectric layer 22;

a first opening extending through the first metal layer 23 and spanning a partial width thereof;

a second metal layer 26, the second metal layer 26 is filled in the first opening and electrically connected to the rest of the first metal layer 23;

a TSV $V_8$, the TSV $V_8$ sequentially extends through the substrate 21 and a partial thickness of the dielectric layer 22 so that the second metal layer 26 is exposed therein; and an interconnect layer 28, the interconnect layer 28 is filled in the TSV $V_8$ and electrically connected to the second metal layer 26.

In summary, the present invention provides a semiconductor device and a method of manufacturing it, in which a first opening is formed by etching away part of a first metal layer, and a second metal layer is filled in the first opening so as to be electrically connected to the remainder of the first metal layer. A TSV extends sequentially through a substrate and a partial thickness of a dielectric layer so that the second metal layer is exposed therein, and an interconnect layer in the TSV is electrically connected to the second metal layer. In this way, the first metal layer can be picked up as long as projections of the second metal layer and the interconnect layer on the substrate are encompassed within a projection of the first metal layer on the substrate, without any additional lateral (in the direction parallel to the substrate) area of the first metal layer being occupied by the TSV, resulting in increased utilization of the wafer's area. The second metal layer that leads out the first metal layer can be formed by only one photolithography process (using a single photomask), resulting in the use of fewer photomasks and reduced process complexity.

The embodiments disclosed herein are described in a progressive manner with the description of each embodiment focusing on its differences from others, and reference can be made between the embodiments for their identical or similar parts. Since the device embodiments correspond to the method embodiments, they are described relatively briefly, and reference can be made to the method embodiments for details in the device embodiments.

The foregoing description presents merely preferred embodiments of the present invention and is not intended to limit the scope of the present invention in any way. Any and all changes and modifications made by those of ordinary skill in the art in light of the above teachings without departing from the spirit of the present invention are intended to be embraced in the scope as defined by the appended claims.

What is claimed is:

1. A method of manufacturing a semiconductor device, comprising:
    providing a first wafer comprising a substrate, a dielectric layer on the substrate and a first metal layer embedded in the dielectric layer;
    etching away part of the first metal layer to form a first opening in the first metal layer;
    forming a second metal layer, which is filled in the first opening and electrically connected to a remainder of the first metal layer;
    forming a through-silicon via (TSV), which sequentially extends through the substrate and a partial thickness of the dielectric layer, and the second metal layer is exposed in the TSV; and
    forming an interconnect layer, which is filled in the TSV and is electrically connected to the second metal layer.

2. The method of manufacturing a semiconductor device of claim 1, wherein the first wafer further comprises a passivation layer, which covers at least the dielectric layer.

3. The method of manufacturing a semiconductor device of claim 2, wherein the passivation layer defines a probing window, in which part of the first metal layer having a protrusion is exposed, and the second metal layer also fills the probing window.

4. The method of manufacturing a semiconductor device of claim 3, wherein the etching away the part of the first metal layer to form a first opening comprises partially or entirely etching away the part of the first metal layer that has the protrusion and is exposed in the probing window, thereby forming the first opening.

5. The method of manufacturing a semiconductor device of claim 2, wherein the passivation layer further covers the entire first metal layer.

6. The method of manufacturing a semiconductor device of claim 5, wherein the etching away the part of the first metal layer to form the first opening comprises:
    etching the passivation layer to form therein a passivation layer opening, the part of the first metal layer exposed in the passivation layer opening;
    forming a patterned photoresist layer, which covers a remainder of the passivation layer and the part of the first metal layer and defines a first window, the first window having a cross-sectional width smaller than a cross-sectional width of the passivation layer opening in a cross-sectional plane perpendicular to the substrate; and
    with the patterned photoresist layer serving as a mask, etching away part of the first metal layer exposed in the first window, thereby forming the first opening, and
    in the step in which the second metal layer is formed, the second metal layer is so formed as to also fill the passivation layer opening.

7. The method of manufacturing a semiconductor device of claim 5, wherein the etching away the part of the first metal layer to form the first opening comprises:
    forming a patterned photoresist layer on the passivation layer, the patterned photoresist layer defining a second window above the first metal layer, the second window having a cross-sectional width smaller than a cross-sectional width of the first metal layer in a cross-sectional plane perpendicular to the substrate; and
    with the patterned photoresist layer serving as a mask, etching away part of the first metal layer exposed in the second window, thereby forming the first opening.

8. The method of manufacturing a semiconductor device of claim 1, wherein the first metal layer, the second metal layer and the interconnect layer are aluminum, copper and copper, respectively, or aluminum, copper and tungsten respectively, or tungsten, copper and copper respectively.

9. The method of manufacturing a semiconductor device of claim 1, further comprising, after the forming of the second metal layer and before the forming of the TSV,
    bonding a side of the first wafer where the second metal layer is exposed to a second wafer.

10. A semiconductor device, comprising:
    a substrate, a dielectric layer on the substrate and a first metal layer embedded in the dielectric layer;
    a first opening extending through a partial width of the first metal layer;
    a second metal layer filled in the first opening and electrically connected to a reminder of the first metal layer;
    a through-silicon via (TSV) extending sequentially through the substrate and a partial thickness of the dielectric layer, and the second metal layer is exposed in the TSV; and
    an interconnect layer filled in the TSV and electrically connected to the second metal layer,
    wherein the first opening extends through an entire thickness of the first metal layer in a thickness direction; and
    both sides of the second metal layer in the thickness direction are exposed by the first metal layer.

11. The semiconductor device of claim 10, further comprising a passivation layer, which covers at least the dielectric layer.

12. The semiconductor device of claim 10, wherein the first metal layer, the second metal layer and the interconnect layer are aluminum, copper and copper, respectively, or aluminum, copper and tungsten respectively, or tungsten, copper and copper respectively.

13. The semiconductor device of claim 10, wherein projections of the second metal layer and the interconnect layer on the substrate are encompassed within a projection of the first metal layer on the substrate.

* * * * *